(12) United States Patent
Maresh et al.

(10) Patent No.: US 10,903,680 B2
(45) Date of Patent: Jan. 26, 2021

(54) STARTER BATTERY WITH CONTINUED FUNCTION AFTER CELL FAILURE

(71) Applicant: International Business Machines Corporation, Armonk, NY (US)

(72) Inventors: Mark Maresh, Wake, NC (US); Richard John Fishbune, Rochester, MN (US); Eric B. Swenson, Pine Island, MN (US); Marc H. Coq, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 34 days.

(21) Appl. No.: 16/354,281

(22) Filed: Mar. 15, 2019

(65) Prior Publication Data
US 2020/0295589 A1    Sep. 17, 2020

(51) Int. Cl.
*H02J 7/14* (2006.01)
*B60R 16/033* (2006.01)
(Continued)

(52) U.S. Cl.
CPC .......... *H02J 7/1461* (2013.01); *B60R 16/033* (2013.01); *F02N 11/06* (2013.01);
(Continued)

(58) Field of Classification Search
CPC ....... B60R 16/00; B60R 16/033; F02N 11/00; F02N 11/06; F02N 11/0862;
(Continued)

(56) References Cited

U.S. PATENT DOCUMENTS

| 4,916,438 A | 4/1990 | Collins et al. |
| 5,304,433 A | 4/1994 | Cherng |

(Continued)

FOREIGN PATENT DOCUMENTS

| DE | 102011075091 A1 | 11/2012 |
| JP | 5105088 B2 | 12/2012 |
| WO | 2017015586 A1 | 1/2017 |

OTHER PUBLICATIONS

Cao et al.; "Battery Balancing Methods: A Comprehensive Review"; IEEE Vehicle Power and Propulsion Conference (VPPC); Sep. 3-5, 2008; 6 Pages.
(Continued)

*Primary Examiner* — Lincoln D Donovan
*Assistant Examiner* — Dave Mattison
(74) *Attorney, Agent, or Firm* — Cantor Colburn LLP; Tihon Poltavets

(57) ABSTRACT

A starter battery with a total battery voltage exceeding a supply voltage requirement of an electrical system. An alternator provides a charging voltage that corresponds with the supply voltage requirement of the electrical system. A total battery voltage equal to the sum of cell voltages exceeds the supply voltage requirement of the electrical system. A step-down voltage regulator reduces the total battery voltage to correspond with the supply voltage requirement and a boost voltage regulator increases the charging voltage from the alternator when charging the starter battery to the total battery voltage. When detecting a degraded cell, the step-down voltage regulator continues to regulate the total battery voltage to correspond with the supply voltage requirement after the cell has degraded and the boost voltage regulator is bypassed when charging the starter battery to no longer increase the charging voltage from the alternator when charging the starter battery.

17 Claims, 3 Drawing Sheets

(51) Int. Cl.
*G08B 21/18* (2006.01)
*F02N 11/06* (2006.01)
*F02N 11/10* (2006.01)
*F02N 11/08* (2006.01)
*G01R 31/392* (2019.01)

(52) U.S. Cl.
CPC ........ *F02N 11/0862* (2013.01); *F02N 11/108* (2013.01); *G01R 31/392* (2019.01); *G08B 21/185* (2013.01); *H02J 7/1423* (2013.01)

(58) Field of Classification Search
CPC ..... F02N 11/108; G01R 31/00; G01R 31/392; G08B 21/00; G08B 21/185; H02J 7/00; H02J 7/1423; H02J 7/1461
USPC ........................................................ 307/10.6
See application file for complete search history.

(56) References Cited

U.S. PATENT DOCUMENTS

| | | | |
|---|---|---|---|
| 6,239,996 | B1 | 5/2001 | Perreault et al. |
| 6,324,339 | B1 | 11/2001 | Hudson et al. |
| 9,472,794 | B1 | 10/2016 | Zakharyan et al. |
| 2013/0020998 | A1 | 1/2013 | Howard |
| 2013/0127611 | A1* | 5/2013 | Bernstein .......... H01M 10/4285 340/455 |
| 2016/0339858 | A1 | 11/2016 | Fink |
| 2017/0373358 | A1 | 12/2017 | Katrak |

OTHER PUBLICATIONS

Emadi et al.; "Power Electronics Intensive Solutions for Advanced Electric, Hybrid Electric, and Fuel Cell Vehicular Power Systems"; IEEE Transactions on Power Electronics; vol. 21, No. 3; May 2006; pp. 567-577.

Ofria; "A Short Course on Charging Systems"; Automotive Charging Systems—A Short Course on How They Work; Retrieved online: https://www.carparts.com/classroom/charging.htm; Retrieved on Mar. 4, 2019; 5 Pages.

* cited by examiner

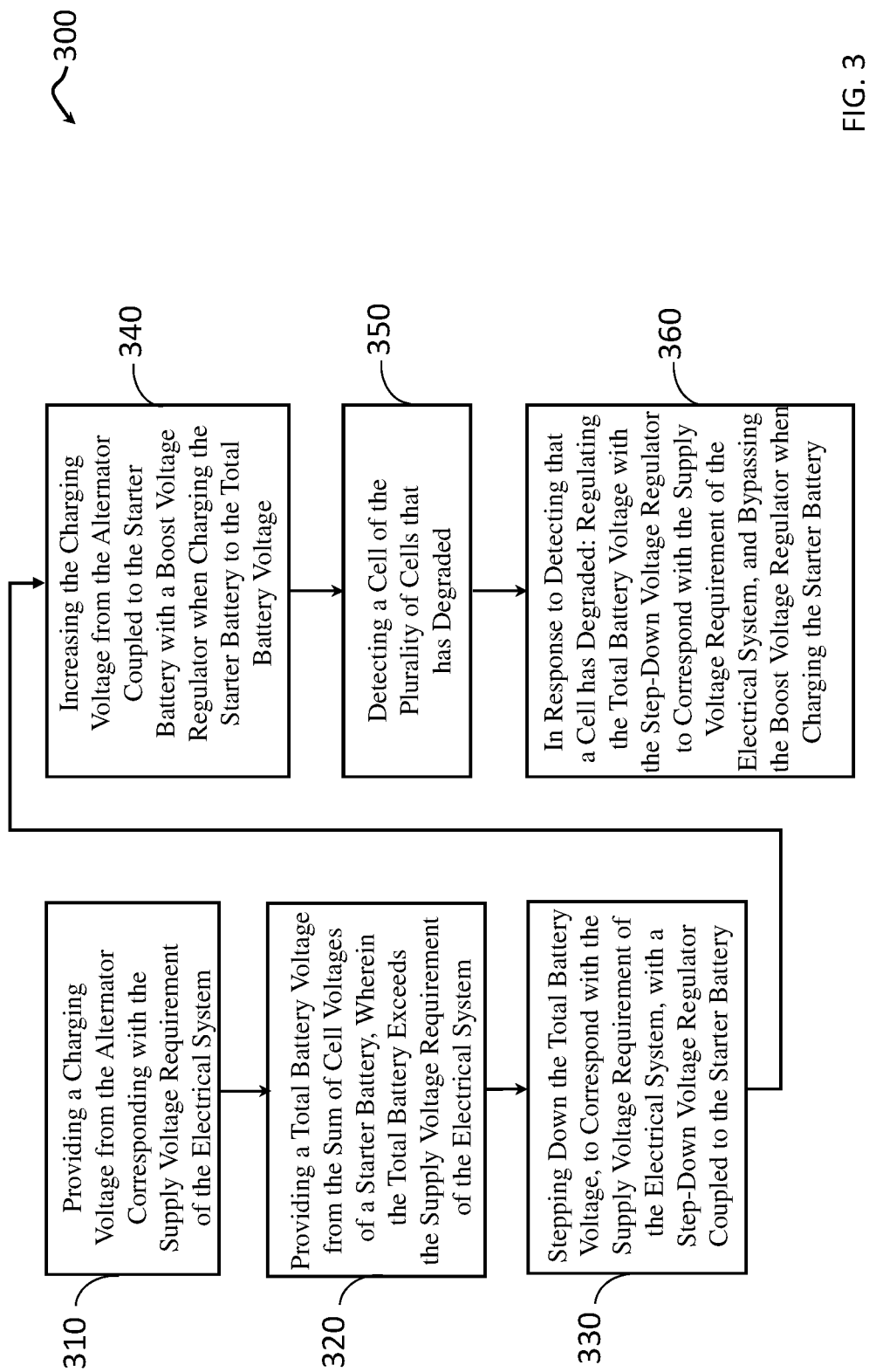

STARTER BATTERY WITH CONTINUED FUNCTION AFTER CELL FAILURE

BACKGROUND

The invention relates generally to starter batteries, and more particularly, to the continued functioning of the starter battery after a degraded cell is detected.

Current lead acid started batteries do not provide sufficient warning of an impending failure. As a result, motorists may become stranded at the most inopportune times. What is needed is the ability to continue to provide sufficient power to an electrical system after detecting a degraded cell and to provide an audible warning of the impending failure of the starter battery.

SUMMARY

According to a non-limiting embodiment, a starter battery for an electrical system having an alternator and a supply voltage requirement, wherein the alternator provides a charging voltage corresponding with the supply voltage requirement of the electrical system, is provided. The starter battery includes a plurality of cells having a total battery voltage equal to the sum of cell voltages of the plurality of cells, wherein the total battery voltage exceeds the supply voltage requirement of the electrical system. The starter battery also includes a step-down voltage regulator coupled to the starter battery to reduce the total battery voltage to correspond with the supply voltage requirement of the electrical system and a boost voltage regulator coupled to the starter battery to increase (step-up) the charging voltage from the alternator when charging the starter battery. When a degraded cell is detected, the step-down voltage regulator continues to regulate the total battery voltage to correspond with the supply voltage requirement of the electrical system after the cell has degraded and the boost voltage regulator is bypassed when charging the starter battery to no longer increase the charging voltage from the alternator when charging the starter battery. In one or more embodiments, each of the plurality of cells include a cell voltage and the sum of the cell voltages of the plurality of cells equals the supply voltage requirement of the electrical system and the starter battery further includes at least one additional cell. Each at least one additional cell has a cell voltage equivalent to the cell voltage of one of the cells of the plurality of cells and the combination of the cell voltages of the plurality of cells along with the cell voltage of the at least one additional cell exceeds the supply voltage requirement when the starter battery and the at least one additional cell are initially charged in the electrical system. In one or more other embodiments, each of the plurality of cells includes a cell voltage and the sum of the cell voltages of the plurality of cells exceeds the supply voltage requirement of the electrical system when the starter battery is initially charged in the electrical system.

According to another non-limiting embodiment, an electrical system for having an alternator and a supply voltage requirement is provided. The electrical system includes a starter battery having a plurality of cells and a total battery voltage equal to the sum of cell voltages of the plurality of cells, wherein the total battery voltage exceeds the supply voltage requirement of the electrical system. The electrical system also includes a step-down voltage regulator coupled to the starter battery to reduce the total battery voltage to correspond with the supply voltage requirement of the electrical system and a boost voltage regulator coupled to the starter battery to increase the charging voltage from the alternator when charging the starter battery to the total battery voltage. When a degraded cell is detected, the step-down voltage regulator continues to regulate the total battery voltage to correspond with the supply voltage requirement of the electrical system after the cell has degraded and the boost voltage regulator is bypassed when charging the starter battery to no longer increase the charging voltage from the alternator when charging the starter battery.

According to yet another non-limiting embodiment, a method for supplying power in an electrical system having an alternator and a supply voltage requirement is provided. The method includes providing a charging voltage from the alternator corresponding with the supply voltage requirement of the electrical system and providing a total battery voltage from the sum of cell voltages from a plurality of cells of a starter battery, wherein the total battery voltage exceeds the supply voltage requirement of the electrical system. The method also includes stepping down the total battery voltage, to correspond with the supply voltage requirement of the electrical system, with a step-down voltage regulator coupled to the starter battery and increasing the charging voltage from the alternator coupled to the starter battery with a boost voltage regulator when charging the starter battery to the total battery voltage. The method also includes detecting a cell of the plurality of cells that have degraded and, in response to detecting that a cell has degraded, regulating the total battery voltage with the step-down voltage regulator to correspond with the supply voltage requirement of the electrical system and bypassing the boost voltage regulator when charging the starter battery.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings, in which:

FIG. 3 is a flow diagram illustrating a method for supplying power in an electrical system according to one or more embodiments of the present invention.

Figure 1:
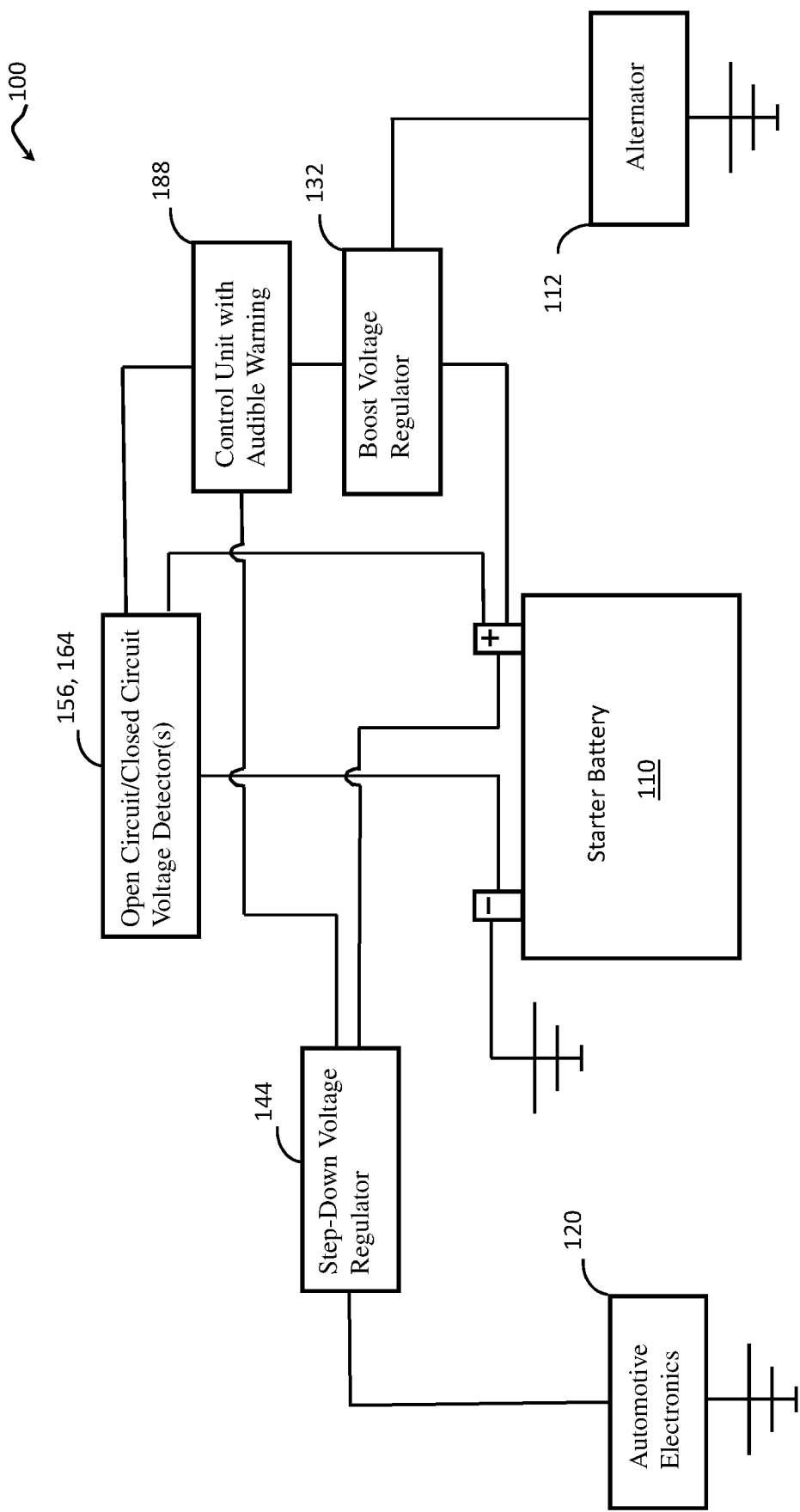
FIG. 1 depicts a block diagram illustrating an exemplary embodiment of an electrical system with a starter battery that may be utilized to implement exemplary embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

Referring to FIG. 1, there is shown an embodiment of an electrical system 100 configured with a starter battery 110 and an alternator 112 for implementing the teachings herein wherein the starter battery 110 provides power for electronics such as, but not limited to, automotive electronics 120 pursuant to a supply voltage requirement of the electrical system 100 and the alternator 112 provides a charging voltage to the starter battery 110. The power requirements of the electronics within the electrical system 100 dictate the supply voltage requirement of a particular electrical system.

An electrical system 100 for a vehicle may have, for example, a 6V, 12V, 24V or 42V voltage requirement and, therefore, may be commonly referred to as a 6V, 12V, 24V or a 42V electrical system. However, some electrical systems utilizing starter batteries and alternators may have different supply voltage requirements. For example, watercraft, aircraft, tractors or other agricultural, construction or forestry vehicles/equipment may have different voltage supply requirements. In any case, an alternator of an electrical system provides a charging voltage for charging the starter battery. The charging voltage depends on the starter battery and the number and types of cells within the starter battery. For example, a 12V starter battery requires a charging voltage of approximately 13.5-14.5V or a 14V starter battery requires a charging voltage of approximately 15.5-16.5V.

The starter battery 110 may be, for example, a lead-acid battery and have any number of cells within a housing. Each cell has a cell voltage and the sum of the cell voltages of the cells within the housing equals a total battery voltage. For example, a 12V starter batter may have six cells of two volts each which equate to 12V. However, each cell typically has a normal open-circuit (no load) voltage of 2.2 volts when fully charged. Alternatively, a 12-volt battery could have four cells of three volts each which equate to 12V.

For example, a typical starter battery 110 for a vehicle has six cells which produce 12V nominal (2V per cell) when the cells are connected in series. However, in one or more embodiments, the starter battery 110 has a total battery voltage that is different than the supply voltage requirement of the electrical system that it is in. For example, the starter battery 110 includes an additional two-volt cell resulting in a 14V starter battery in an electrical system with a supply voltage requirement of only 12V. In one or more embodiments, six 2.4V cells are utilized resulting in a 14.4V starter battery in a 12V electrical system. Thus, an increased total battery voltage, to account for degradation of a cell, may be utilized in an electrical system which exceeds the supply voltage requirements of the electrical system without changing or modify electronic powered by the electrical system.

Alternatively, the cell voltages of any number of cells could be summed up to a total battery voltage which exceeds the supply voltage requirement. Thus, when a cell fails or is degraded the total battery voltage will still equate to the supply voltage requirement of the electrical system. In other words, the starter battery 110 with an extra cell provides enough voltage to start a vehicle after one of the cells has failed or is degraded. For example, when a 2V cell is degraded in a 14V starter battery in a 12V electrical system, that starter battery still produces 12V for its 12V electrical system.

When a starter battery 110 with a total battery voltage exceeds the supply voltage requirement of its electrical system, the charging voltage of that electrical system must be greater than what is typically output from a standard automobile alternator. For example, an alternator in a 12V electrical system provides a charging voltage of 13.5-14.5V. Thus, to charge a 14V starter battery 110 that has an extra cell, for example, an extra 2V cell, the charging voltage must be boosted to about 15.5-16.5V. In such case, a boost voltage regulator 132 is coupled to the starter battery 110 as shown in FIG. 1. The boost voltage regulator 132 steps up the standard charging voltage coming from the alternator from the standard 13.5-14.5V to the increased charging voltage of 15.5-16.5V.

Because a standard automobile electrical system is designed to run off of 12V nominal, a step-down voltage regulator 144 is coupled to the starter battery 110 as shown in FIG. 1. The step-down voltage regulator 144 reduces the output voltage of the starter battery 110 from about 14V nominal to about 12V nominal in order to correctly power the automotive electronics 120. An electrical system having a starter battery 110 with an increased total battery voltage also includes an open-circuit voltage detection device 156. The open-circuit voltage detection device 156 determines if one or more of the cells of the starter battery 110 has degraded to the point it no longer provides sufficient cell voltage to the remaining series of cells. For example, a starter battery 110 that has dropped from 14V nominal to less than 14V would indicate one or more cells have degraded. Measurements with the open-circuit voltage detection device 156 are preferably taken after the vehicle is turned off or periodically when the starter battery 110 is not charging.

Still referring to FIG. 1, the electrical system also includes a closed-circuit voltage detection device 164. In one or more embodiments, the open-circuit voltage detection device 156 and the closed-circuit voltage detection device 164 may be combined into and function as a single device. The closed-circuit voltage detection device 164 measures dv/dt (voltage change divided by the change in time) to determine if there is a shorted or bad cell or if the voltage drop was due to discharging of the starter battery 110. If the voltage drop is due to discharging, the starter battery 110 is operating normally. Preferably, the closed-circuit voltage detection device 164 takes measurements while the vehicle is being started. In one or more embodiments, the electrical system includes a control unit 188. The measurements from the open-circuit voltage detection device 156 and the closed-circuit voltage detection device 164 are fed to the control unit 188.

The control unit 188 receives the measurements from the open-circuit voltage detection device 156 and the closed-circuit voltage detection device 164. If it is determined that a cell is degraded, the starter battery 110 will continue to use the step-down voltage regulator 144 to regulate the output voltage of the starter battery 110 to correspond with the supply voltage requirement of the electrical system. For example, the step-down voltage regulator 144 would regulate the output voltage to 12V. Also, if it is determined that a cell is degraded, the boost voltage regulator 132 is then bypassed so that the starter battery 110 is not damaged. The boost voltage regulator 132 is bypassed to no longer boost the charging voltage from the alternator 112 because the starter battery 110 is no longer operating at, for example, 14V nominal.

The control unit 188 preferably includes an audible alarm. The alarm could provide an audible warning to vehicle operators that their starter battery 110 with a degraded cell should be replaced. For example, when a starter battery 110 that once had an initial total battery voltage of 14V but now has a degraded cell and now only provides an output voltage of 12V in a 12V electrical system, the control unit 188 would provide an audible alarm. In one or more embodiments, in response to detecting that at least one cell is degraded, an audible alarm is generated for indicating the impending failure of the starter battery 110 and that the starter battery 110 should be replaced even though the total battery voltage of the starter battery 110 still corresponds with the supply voltage requirement of the electrical system. In one or more embodiments, the audible alarm is provided when a vehicle is started and then the audible alarm is shut off after a period of time.

Figure 2:
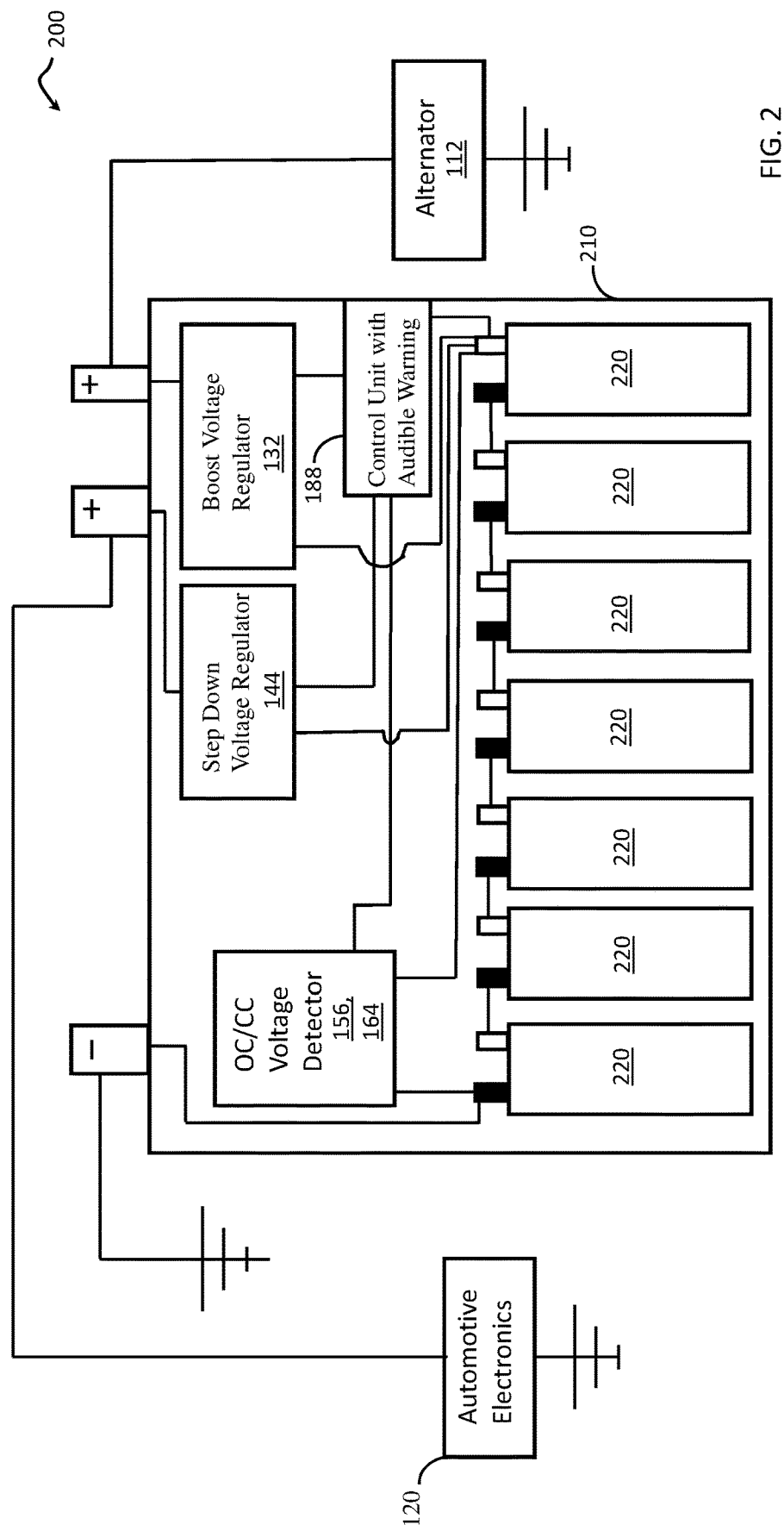
FIG. 2 depicts a block diagram illustrating an exemplary embodiment of a starter battery in an electrical system according to one or more embodiments of the present invention.

In some embodiments, one or more of the boost voltage regulator 132, step-down voltage regulator 144, open-circuit voltage detection device 156, closed-circuit voltage detection device 164, and the control unit 188 may be housed within the housing of a starter battery. In FIG. 2, for example, an electrical system 200 includes a starter battery 210 for powering electronics such as automobile electronics 120. The electrical system 100 of FIG. 1 is similar to the electrical system 200 of FIG. 2 in that at least one extra cell is provided in the event that another cell fails or becomes degraded so that the output voltage of the starter battery then remains sufficient to meet the supply voltage requirements of the electrical system and so that a warning may be provided that the starter battery needs to be replaced.

However, FIG. 2 is distinguishable from FIG. 1 in that the boost voltage regulator 132, step-down voltage regulator 144, open-circuit voltage detection device 156, closed-circuit voltage detection device 164, and the control unit 188 are contained within the housing of the starter battery 210. The starter battery 210 includes two positive terminals because one receives the voltage output from the alternator 112 which is then provided to the boost voltage regulator 132 and the other is from the step-down voltage regulator 144 which then provides power to the automobile electronics 120. Thus, in one or more embodiments, each additional cell would have a cell voltage equivalent to the cell voltage of the other cells of the starter battery and the combination of the cell voltages of the cells of the starter battery and the cell voltage of the at least one additional cell would exceed the supply voltage requirement when the starter battery with the at least one additional cell are initially charged in the electrical system.

FIG. 2 also depicts seven cells 220 within the housing of the starter battery 210. For example, if starter battery 210 is a 14V starter battery, each of the seven cells would have a cell voltage of 2V. In other words, there is an additional cell providing a cell voltage sufficient to maintain the voltage output of the starter battery at the supply voltage required for a particular electrical system in the event another cell of that starter battery becomes degraded or fails. In one or more embodiments, one or more additional cells may be coupled to the starter battery. For example, a 12V starter battery having six 2V cells within its house may be combined with an additional 2V cell to constitute a total battery voltage of 14V to be used in a 12V electrical system.

Turning to FIG. 3, one or more embodiments may include a method 300 for supplying power in an electrical system having an alternator 112 and a supply voltage requirement. The flow diagram of FIG. 3 illustrates the method 300 that includes process block 310 for providing a charging voltage from the alternator 112 corresponding with the supply voltage requirement of the electrical system. The method 300 also includes process block 320 for providing a total battery voltage from the sum of cell voltages from a plurality of cells of a starter battery 110, 210 wherein the total battery voltage exceeds the supply voltage requirement of the electrical system, and process block 330 for stepping down the total battery voltage, to correspond with the supply voltage requirement of the electrical system, with a step-down voltage regulator coupled to the starter battery 110, 210. Method 300 also includes process block 340 for increasing the charging voltage from the alternator 112 coupled to the starter battery 110, 210 with a boost voltage regulator when charging the starter battery 110, 210 to the total battery voltage. At process block 350 the method 300 includes detecting a cell of the plurality of cells that has degraded. The method 300 then includes process block 360 for, in response to detecting that a cell has degraded, regulating the total battery voltage with the step-down voltage regulator to correspond with the supply voltage requirement of the electrical system and bypassing the boost voltage regulator when charging the starter battery 110, 210.

In one or more embodiments, the method 300 may also include an open-circuit voltage detection device 156 determining, while not charging the starter battery 110, 210, if one or more of the cells of the plurality of cells is degraded. The method 300 may also include a closed-circuit voltage detection device 164 measuring a dV/dT (voltage change divided by the change in time) to determine if one or more cells of the plurality of cells is shorted or bad or if a voltage drop of the starter battery 110, 210 was due to discharging. The method 300 may also include, in response to detecting a cell of the plurality of cell has degraded, providing an audible alarm for indicating the impending failure of the starter battery 110, 210 and that the starter battery 110, 210 should be replaced even though the total battery voltage of the starter battery 110, 210 still corresponds with the supply voltage requirement. The method 300 may also include the audible alarm being provided when a vehicle is started and then the audible alarm being shut off after a period of time.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A starter battery for an electrical system having an alternator and a supply voltage requirement, wherein the alternator provides a charging voltage corresponding with the supply voltage requirement of the electrical system, the starter battery comprising:
    a plurality of cells having a total battery voltage equal to a sum of cell voltages of the plurality of cells, wherein each of the plurality of cells comprises a cell voltage and the sum of the cell voltages of the plurality of cells equals the supply voltage requirement of the electrical system;
    at least one additional cell, each at least one additional cell having a cell voltage equivalent to the cell voltage of one of the cells of the plurality of cells, wherein the combination of the cell voltages of the plurality of cells and the cell voltage of the at least one additional cell exceeds the supply voltage requirement when the starter battery and the at least one additional cell are initially charged in the electrical system;
    a step-down voltage regulator coupled to the starter battery to reduce (step-down) the total battery voltage to correspond with the supply voltage requirement of the electrical system; and
    a boost voltage regulator coupled to the starter battery to increase (step-up) the charging voltage from the alternator when charging the starter battery to the total battery voltage;
    wherein when detecting a cell of the plurality of cells has degraded, the step-down voltage regulator continues to regulate the total battery voltage to correspond with the supply voltage requirement of the electrical system after the cell has degraded and the boost voltage regulator is bypassed when charging the starter battery.

2. The starter battery of claim 1 wherein the electrical system is a 12V electrical system, the plurality of cells comprises six 2V cells, and wherein there is one additional cell of 2V such that the starter battery is a 14V starter battery in a 12V electrical system.

3. The starter battery of claim 1 wherein each of the plurality of cells comprises a cell voltage and the sum of the cell voltages of the plurality of cells exceeds the supply voltage requirement of the electrical system when the starter battery is initially charged in the electrical system.

4. The starter battery of claim 3 wherein the electrical system is a 12V electrical system and the plurality of cells comprises six 2.4V cells such that the starter battery is a 14.4V starter battery in a 12V electrical system.

5. The starter battery of claim 1 wherein the starter battery is a 14V starter battery in a 12V electrical system of a vehicle and wherein the charging voltage of the alternator is approximately 13.5V to 14.5V that is boosted by the boost voltage regulator to approximately 15.5V to 16.5V.

6. The starter battery of claim 1 further comprising an open-circuit voltage detection device for determining while not charging the starter battery if one or more of the cells of the plurality of cells is degraded.

7. The starter battery of claim 1 further comprising a closed-circuit voltage detection device for measuring a dV/dT to determine if one or more cells of the plurality of cells is shorted or bad or if a voltage drop of the starter batter was due to discharging.

8. The starter battery of claim 1 further comprising, if one of the cells is degraded, continuing to use the step-down voltage regulator to regulate the total battery voltage to correspond with the supply voltage requirement after the one cell is degraded and bypassing the boost voltage regulator to no longer increase the charging voltage from the alternator when charging the starter battery.

9. The starter batter of claim 1 further comprising, in response to detecting at least one cell is degraded, an audible alarm for indicating impending failure of the starter battery and that the starter battery should be replaced wherein the total battery voltage of the starter battery still corresponds with the supply voltage requirement.

10. An electrical system having an alternator and a supply voltage requirement, the electrical system comprising:
    a starter battery comprising a plurality of cells having a total battery voltage equal to a sum of cell voltages of the plurality of cells, wherein the total battery voltage exceeds the supply voltage requirement of the electrical system, wherein the plurality of cells comprises six 2V cells, and wherein there is one additional cell of 2V such that the starter battery is a 14V starter battery in a 12V electrical system;
    a step-down voltage regulator coupled to the starter battery to reduce (step-down) the total battery voltage to correspond with the supply voltage requirement of the electrical system; and
    a boost voltage regulator coupled to the starter battery to increase a charging voltage from the alternator when charging the starter battery to the total battery voltage;
    wherein when detecting a cell of the plurality of cells has degraded, the step-down voltage regulator continues to regulate the total battery voltage to correspond with the supply voltage requirement of the electrical system after the cell has degraded and the boost voltage regulator is bypassed when charging the starter battery to no longer increase the charging voltage from the alternator when charging the starter battery.

11. The electrical system of claim 10 wherein each of the plurality of cells comprises a cell voltage and the sum of the cell voltages of the plurality of cells equals the supply voltage requirement of the electrical system and wherein the electrical system further comprises at least one additional cell, each at least one additional cell having a cell voltage equivalent to the cell voltage of one of the cells of the plurality of cells, wherein the combination of the cell voltages of the plurality of cells and the cell voltage of the at least one additional cell exceeds the supply voltage requirement when the starter battery and the at least one additional cell are initially charged in the electrical system.

12. The electrical system of claim 10 wherein the electrical system is a 12V electrical system and the plurality of cells comprises six 2.4V cells such that the starter battery is a 14.4V starter battery in a 12V electrical system.

13. The electrical system of claim 10 further comprising an open-circuit voltage detection device for determining while not charging the starter battery if one or more of the cells of the plurality of cells is degraded and a closed-circuit voltage detection device for measuring a dV/dT to determine if one or more cells of the plurality of cells is shorted or bad or if a voltage drop of the starter batter was due to discharging, and wherein, if one of the cells is degraded, the step-down voltage regulator is continued to be used to regulate the total battery voltage to correspond with the supply voltage requirement after the one cell is degraded, the boost voltage regulator is bypassed to no longer increase the charging voltage from the alternator when charging the starter battery, and an audible alarm is provided for indicating an impending failure of the starter battery and that the starter battery should be replaced despite the total battery voltage of the starter battery when charged still corresponding with the supply voltage requirement.

14. A method for supplying power in an electrical system having an alternator and a supply voltage requirement, the method comprising:

providing a charging voltage from the alternator corresponding with the supply voltage requirement of the electrical system;

providing a total battery voltage from a sum of cell voltages from a plurality of cells of a starter battery, wherein the total battery voltage exceeds the supply voltage requirement of the electrical system;

stepping down the total battery voltage, to correspond with the supply voltage requirement of the electrical system, with a step-down voltage regulator coupled to the starter battery;

increasing the charging voltage from the alternator coupled to the starter battery with a boost voltage regulator when charging the starter battery to the total battery voltage;

detecting a cell of the plurality of cells that has degraded using a closed-circuit voltage detection device measuring a dV/dT to determine if one or more cells of the plurality of cells is shorted or bad or if a voltage drop of the starter battery was due to discharging; and in response to detecting that a cell has degraded:
  regulating the total battery voltage with the step-down voltage regulator to correspond with the supply voltage requirement of the electrical system; and
  bypassing the boost voltage regulator when charging the starter battery.

15. The method of claim 14 wherein detecting a cell of the plurality of cells that has degraded comprises an open-circuit voltage detection device determining, while not charging the starter battery, if one or more of the cells of the plurality of cells is degraded.

16. The method of claim 14 further comprising, in response to detecting a cell of the plurality of cell has degraded, providing an audible alarm for indicating an impending failure of the starter battery and that the starter battery should be replaced wherein the total battery voltage of the starter battery still corresponds with the supply voltage requirement.

17. The method of claim 16 wherein the audible alarm is provided when a vehicle is started and then the audible alarm is shut off after a period of time.

* * * * *